United States Patent
Huang et al.

(10) Patent No.: US 11,132,030 B2
(45) Date of Patent: Sep. 28, 2021

(54) ELECTRONIC DEVICE

(71) Applicant: GETAC TECHNOLOGY CORPORATION, Hsinchu County (TW)

(72) Inventors: Tzu-Chiu Huang, Taipei (TW); Juei-Chi Chang, Taipei (TW)

(73) Assignee: GETAC TECHNOLOGY CORPORATION, Hsinchu County (TW)

(*) Notice: Subject to any disclaimer, the term of this patent is extended or adjusted under 35 U.S.C. 154(b) by 0 days.

(21) Appl. No.: 17/023,328

(22) Filed: Sep. 16, 2020

(65) Prior Publication Data

US 2021/0089089 A1 Mar. 25, 2021

Related U.S. Application Data

(60) Provisional application No. 62/904,967, filed on Sep. 24, 2019.

(51) Int. Cl.

| G06F 1/16 | (2006.01) |
|---|---|
| H01Q 1/22 | (2006.01) |
| H05K 5/02 | (2006.01) |
| H05K 5/06 | (2006.01) |
| H05K 5/00 | (2006.01) |
| H05K 5/04 | (2006.01) |
| E05D 3/02 | (2006.01) |
| E05D 5/04 | (2006.01) |
| F16C 11/04 | (2006.01) |

(52) U.S. Cl.
CPC ............ *G06F 1/1656* (2013.01); *E05D 3/02* (2013.01); *E05D 5/04* (2013.01); *F16C 11/04* (2013.01); *G06F 1/1654* (2013.01); *G06F 1/1679* (2013.01); *G06F 1/1683* (2013.01); *H01Q 1/2266* (2013.01); *H05K 5/0017* (2013.01); *H05K 5/0204* (2013.01); *H05K 5/04* (2013.01); *H05K 5/061* (2013.01); *H05K 5/069* (2013.01); *E05Y 2900/606* (2013.01); *G06F 1/1616* (2013.01)

(58) Field of Classification Search
CPC ..... G06F 1/1616; G06F 1/1637; G06F 1/1656
See application file for complete search history.

(56) References Cited

U.S. PATENT DOCUMENTS

| 2014/0110036 A1* | 4/2014 | Mase | G06F 1/1601 |
|---|---|---|---|
| | | | 156/60 |
| 2020/0348725 A1* | 11/2020 | Kim | H05K 5/03 |
| 2021/0072587 A1* | 3/2021 | Tang | G02F 1/133528 |
| 2021/0200272 A1* | 7/2021 | Norton, Jr. | G06F 1/1656 |

* cited by examiner

Primary Examiner — Anthony Q Edwards

(57) ABSTRACT

Provided is an electronic device including a base structure, panel, water blocking film and first glue structure. The base structure has a first surface and a second surface. The base structure includes a base body, receiving recess and slit. The panel is disposed in the receiving recess and on the second surface. The panel includes a panel body and a first signal transmission element connected to the panel body. The first signal transmission element passes through the slit. The water blocking film is disposed on the first surface of the base structure to cover the slit. A first hole is disposed between the base structure and first signal transmission element or between the water blocking film and first signal transmission element. The first glue structure is disposed in the first hole. A first water blocking region is formed between the base structure, water blocking film and first glue structure.

9 Claims, 18 Drawing Sheets

ELECTRONIC DEVICE

CROSS-REFERENCE TO RELATED APPLICATIONS

The present application claims the benefit of U.S. provisional Patent Application No. 62/904,967, filed on Sep. 24, 2019, the disclosure of which is hereby incorporated by reference herein in its entirety.

BACKGROUND OF THE INVENTION

Field of the Invention

The present disclosure relates to electronic devices and, more particularly, to an electronic device applicable to laptops.

Description of the Prior Art

According to prior art, a display unit of a laptop typically comes with a panel and a lens module. If moisture or liquid intrudes into connectors or circuits of the panel and lens module, the panel and lens module will be damaged.

To augment the water-blocking capability of the panel and lens module, the prior art always discloses a water blocking strip disposed at the outermost region of the display unit. However, a resultant water blocking region is overly large to the detriment of the water blocking efficiency because of screw-related issues and flatness issues which arise while the display unit is being mounted in place.

Therefore, it is imperative to make improvements to structural design, so as to enhance the performance of display units of laptops and the water-blocking capability of the display units.

SUMMARY OF THE INVENTION

It is an objective of the present disclosure to provide an electronic device.

In order to achieve the above and other objectives, the present disclosure provides an electronic device comprising a base structure, a panel, a water blocking film and a first glue structure. The base structure has a first surface and a second surface corresponding in position to the first surface. The base structure comprises a base body, a receiving recess disposed on the base body, and a slit penetrating the base body. The panel is disposed in the receiving recess and on the second surface. The panel comprises a panel body and a first signal transmission element. The first signal transmission element is connected to the panel body and passes through the slit. The water blocking film is disposed on the first surface of the base structure and covers the slit. A first hole is disposed between the base structure and the first signal transmission element or disposed between the water blocking film and the first signal transmission element. The first glue structure is disposed in the first hole. A first water blocking region is formed between the base structure, the water blocking film and the first glue structure.

One of the beneficial effects of the present disclosure is as follows: the electronic device of the present disclosure is advantageously characterized by a first water blocking region formed between the base structure, the water blocking film and the first glue structure to augment the water-blocking capability of the electronic device.

The technical features of the present disclosure are illustrated by specific embodiments, depicted with drawings, and described below. However, the drawings serve exemplary and illustrative purposes rather than limit the present disclosure.

DETAILED DESCRIPTION OF THE EMBODIMENTS

An electronic device is provided according to the present disclosure and hereunder illustrated by specific embodiments. Persons skilled in the art can gain insight into its advantages and effects accordingly. The present disclosure can be implemented or applied in accordance with any other variant embodiments. Various modifications and changes may be made to the details described in the specification from different perspectives and for different applications without departing from the spirit of the present disclosure. The accompanying drawings are deemed illustrative and thus are not drawn to scale. The embodiments presented below are illustrative of the technical features of the present disclosure rather than restrictive of the claims of the present disclosure. Although ordinal numbers, such as "first," "second," and "third," are used herein to specify components, the ordinal numbers are intended to distinguish the components from each other rather than limit them. The conjunction "or" used before the last in a list of possibilities must be interpreted, as appropriate, to mean an "exclusive or" or an "inclusive or".

Embodiment

Figure 1:
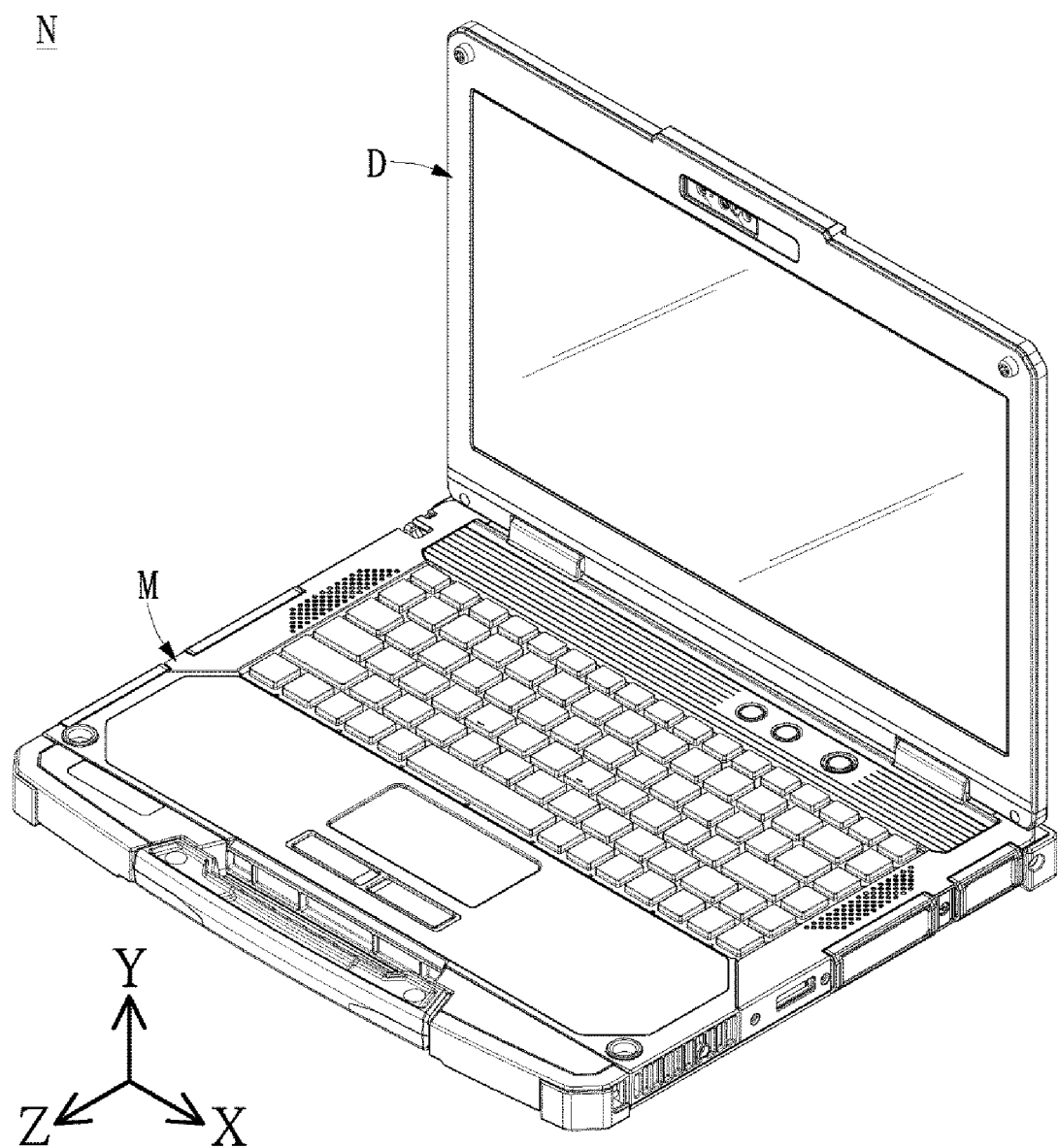
FIG. 1 is a perspective view of an electronic device according to an embodiment of the present disclosure.
Figure 2:
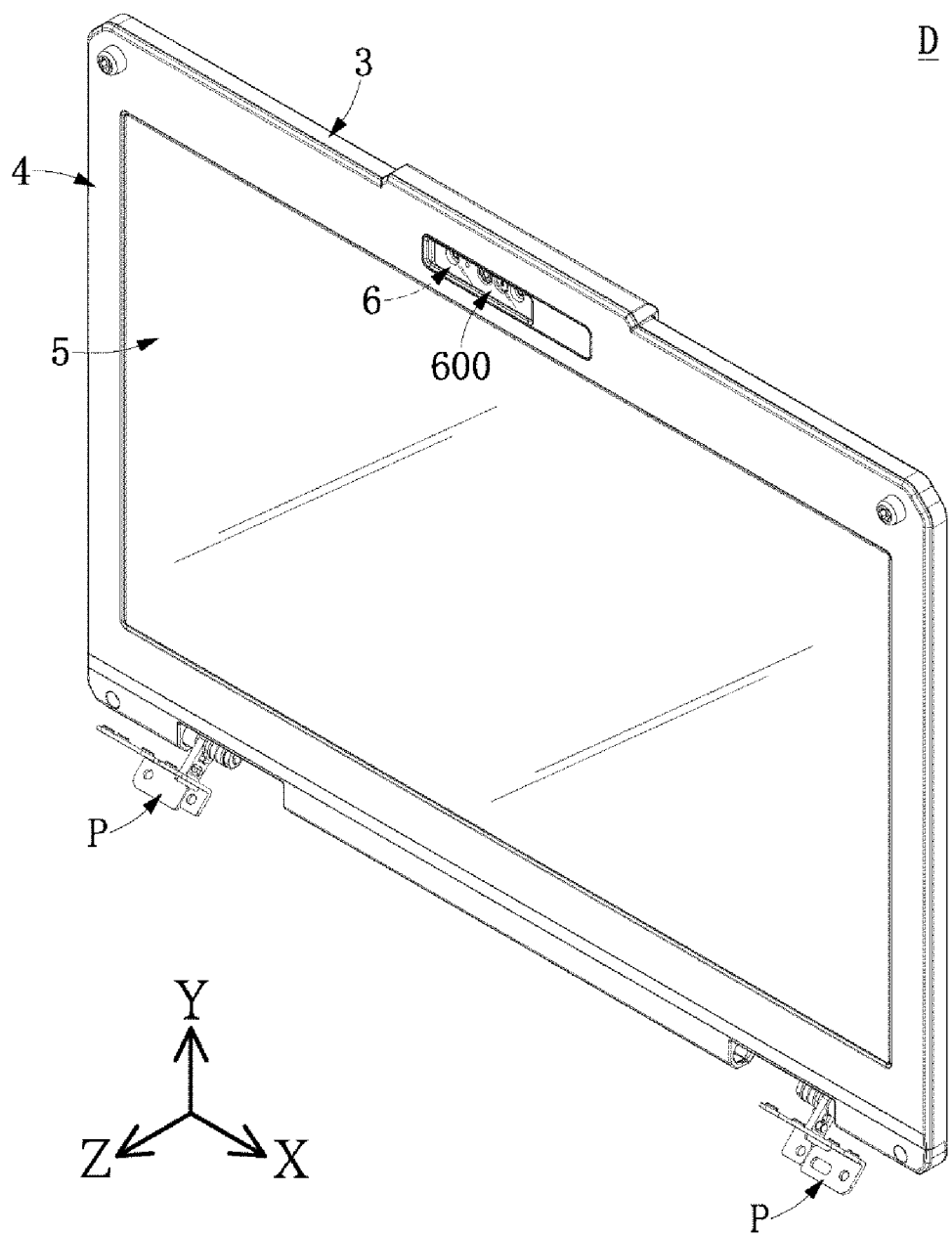
FIG. 2 is an assembled perspective view of the electronic device according to an embodiment of the present disclosure.
Figure 3:
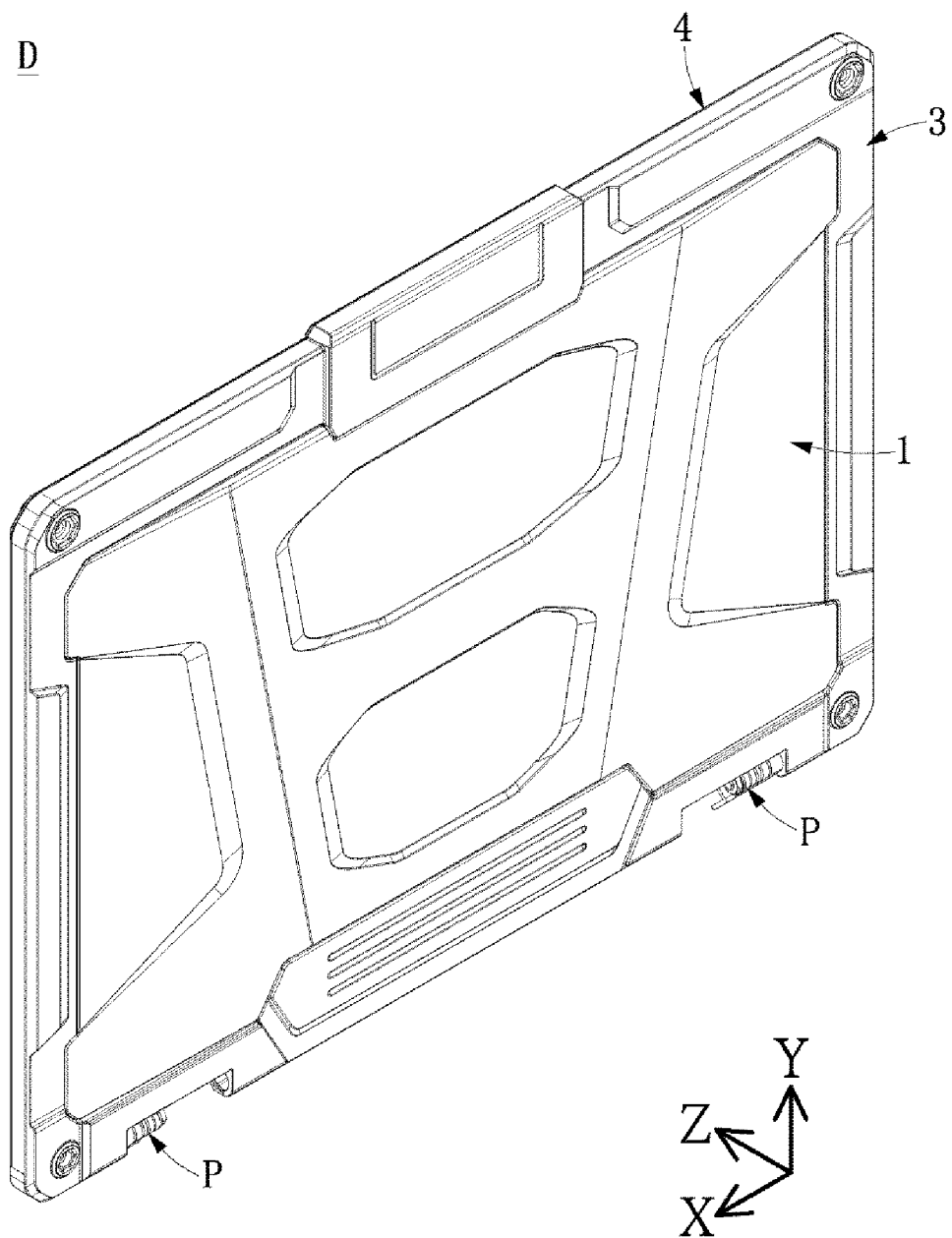
FIG. 3 is another assembled perspective view of the electronic device according to an embodiment of the present disclosure.

Referring to FIG. 1 through FIG. 3, for example, the present disclosure provides an electronic device N. The electronic device N is a laptop, but the present disclosure is not limited thereto. The present disclosure is effective in attaining the water-blocking capability of a lens module 6 and a panel 5 of the electronic device N to preclude the effect of ambient moisture or liquid on the lens module 6 and the panel 5. Among the accompanying drawings of the present disclosure, only FIG. 1 shows a laptop in its entirety in order to depict the connections of its constituent elements.

Referring to FIG. 1 through FIG. 3 and FIG. 4 through FIG. 7, the electronic device N of the present disclosure is exemplified by a laptop. The laptop comprises a display unit D and a host M. The display unit D is disposed on the host M and rotates pivotally relative to the host M. The essential structural features which the electronic device N must have in order for the electronic device N to be applicable to a display unit of a laptop are described below. The structural features required for water blocking regions of a lens module 6 and a panel 5 of the electronic device N are described later. The electronic device N comprises a base structure 1, a panel 5, an antenna module 2, a first decorative board 3, a second decorative board 4 and a pivotal unit P. The base structure 1 has a first surface S101 and a second surface S102 corresponding in position to the first surface S101. The base structure 1 comprises a base body 11, a receiving slot 12 disposed on the base body 11, a receiving recess 13 disposed on the base body 11, a slit 100 penetrating the base body 11, and a lens holder 14 disposed on the base body 11. For instance, the electronic device N of the present disclosure comprises two receiving slots 12, and the lens holder 14 is disposed between the two receiving slots 12, but the present disclosure is not limited thereto.

The panel 5 is disposed in the receiving recess 13. The panel 5 is disposed on the second surface S102. The panel 5 comprises a panel body 51 and a first signal transmission element 52 connected to the panel body 51. The first signal transmission element 52 passes through the slit 100. The antenna module 2 is disposed in the receiving slots 12 of the base structure 1. For instance, the panel body 51 is disposed in the receiving recess 13 of the base structure 1 and abuts against the second surface S102. The panel body 51 is fixed to the second surface S102 of the base structure 1 with an adhesive (not shown), but the present disclosure is not limited thereto. For instance, in an embodiment, the base structure 1 is made of metal, including but not limited to an aluminum-magnesium alloy, to support the panel 5 and the antenna module 2 and protect the panel 5 and the antenna module 2, but the present disclosure is not limited thereto. The first decorative board 3 is disposed on the first surface S101 of the base structure 1. The second decorative board 4 is disposed on the second surface S102 of the base structure 1. The pivotal unit P is disposed on the base structure 1. The pivotal unit P comprises a first pivotal plate P1 disposed on the base structure 1 and a second pivotal plate P2 connected to the first pivotal plate P1 and capable of rotating pivotally relative to the first pivotal plate P1.

The first decorative board 3 is disposed on the first surface S101 of the base structure 1. The first decorative board 3 has a first opening 30 for exposing the first surface S101 of the base structure 1. Therefore, when the first decorative board 3 is mounted on the base structure 1, the first surface S101 of the base structure 1 is exposed relative to the first decorative board 3. For instance, the first decorative board 3 is made of a material different from that of the base structure 1. In an embodiment, the first decorative board 3 is made of plastic, but the present disclosure is not limited thereto. The second decorative board 4 is disposed on the second surface S102 of the base structure 1. The second decorative board 4 has a second opening 40 for exposing the panel body 51 disposed on the second surface S102 of the base structure 1. Therefore, when the second decorative board 4 is mounted on the base structure 1, the panel body 51 is exposed relative to the second decorative board 4. For instance, the second decorative board 4 is made of a material different from that of the base structure 1. In an embodiment, second decorative board 4 is made of plastic, but the present disclosure is not limited thereto.

The base body 11 has a first edge 111, a second edge 112 corresponding in position to the first edge 111, a third edge 113, and a fourth edge 114 corresponding in position to the third edge 113. The base structure 1 further comprises a plurality of extension angles 15 connected to corners of the base body 11. For instance, the base structure 1 comprises a first extension angle 151 connected to one of the corners of the base body 11 and a second extension angle 152 connected to another corner of the base body 11. The first extension angle 151 is disposed at the corner between the first edge 111 and third edge 113. The second extension angle 152 is disposed at the corner between the second edge 112 and third edge 113. One of the receiving slots 12 for receiving the antenna module 2 is disposed between the first extension angle 151 and the lens holder 14. The other one of the receiving slots 12 for receiving the antenna module 2 is disposed between the second extension angle 152 and the lens holder 14, but the present disclosure is not limited thereto.

Preferably, the base structure 1 further comprises a third extension angle 153 connected to yet another corner of the base body 11 and a fourth extension angle 154 connected to still yet another corner of the base body 11. The third extension angle 153 is disposed at the corner between the first edge 111 and third edge 113. The fourth extension angle 154 is disposed at the corner between the second edge 112 and the fourth edge 114. The first extension angle 151, second extension angle 152, third extension angle 153 and fourth extension angle 154 are disposed at four corners of the receiving recess 13, respectively; thus, when the electronic device N falls, the first extension angle 151, second extension angle 152, third extension angle 153 and/or fourth extension angle 154 can protect the panel 5 against an impact which might otherwise damage the panel 5. Preferably, the base body 11, lens holder 14, first extension angle 151, second extension angle 152, third extension angle 153 and fourth extension angle 154 are integrally formed, so as to form the base structure 1.

Referring to FIG. 4 through FIG. 7, FIG. 8 and FIG. 9, structural features of the water blocking region of the panel 5 are described further below. The first signal transmission element 52 passes through the slit 100 in the direction from the second surface S102 to the first surface S101 and is electrically connected to the host M by running along the base body 11. For instance, the first signal transmission element 52 comprises a first transmission line 521 electrically connected to the panel body 51, a second transmission line 522 electrically connected to the host M, and a first connector 523 electrically connected between the first transmission line 521 and second transmission line 522. The first transmission line 521 and second transmission line 522 are connected by the first connector 523. However, the present disclosure is not limited thereto. In an embodiment, the first signal transmission element 52 further comprises a first substrate 520. The first substrate 520 is disposed on the first surface S101 of the base structure 1 through a fastening element S (including but not limited to a screw). The first substrate 520 is positioned proximate to the slit 100. The first connector 523 is disposed on the first substrate 520.

To prevent moisture from passing through the slit 100 in the direction from the first surface S101 to the second surface S102 to the detriment of the performance of electronic parts and components, such as the panel 5, the electronic device N further comprises a water blocking film 8 and a first glue structure G1. The water blocking film 8 is disposed on the first surface S101 of the base structure 1 and covers the slit 100. The vertical projection of the water blocking film 8 on the base structure 1 has the same outline as the slit 100. A first hole H1 is disposed between the base structure 1 and the first signal transmission element 52 or disposed between the water blocking film 8 and the first signal transmission element 52. The first glue structure G1 is disposed in the first hole H1. Therefore, a first water blocking region Z1 is formed between the base structure 1, the water blocking film 8 and the first glue structure G1.

Preferably, the electronic device N further comprises a connection structure Q. The connection structure Q is disposed on the first surface S101 of the base structure 1 through a fastening element S. A pore Q10 is disposed between the connection structure Q and the base structure 1 or disposed on the connection structure Q. The first signal transmission element 52 can pass through the pore Q10. For instance, before being connected to the panel body 51, the first transmission line 521 is connected to the first connector 523 disposed on the first substrate 520. Then, the second transmission line 522 is connected to the first connector 523, whereas the second transmission line 522 passes through the pore Q10 and gets connected to the host M by running along the base body 11. The base structure 1 further comprises a recess 16 disposed around the slit 100 and dented relative to the base body 11. The recess 16 has an attachment surface 160. The water blocking film 8 is attachedly disposed on the attachment surface 160 to close the slit 100.

When the connection structure Q is disposed on the base structure 1, a surface (not denoted with any reference numeral) of the connection structure Q is flush with the attachment surface 160, such that the water blocking film 8 is attachedly disposed on the connection structure Q. The first hole H1 is disposed between the base structure 1 and second transmission line 522 or disposed between the water blocking film 8 and second transmission line 522. The first glue structure G1 is disposed in the first hole H1. The first hole H1 is disposed between the second transmission line 522 and the base structure 1 or disposed on the second transmission line 522 and the water blocking film 8 when the second transmission line 522 passes through the pore Q10; thus, the first glue structure G1 is disposed in the first hole H1, such that the first water blocking region Z1 is formed between the base structure 1, the water blocking film 8 and the first glue structure G1.

For instance, the first glue structure G1 is a glue which the first hole H1 is filled with. The water blocking film 8 is light-penetrable. The light-penetrable water blocking film 8 is for use in checking whether the first transmission line 521 and/or second transmission line 522 are/is firmly mounted in place during the assembly process of the electronic device N. However, the present disclosure is not limited to the aforesaid examples.

Referring to FIG. 10 through FIG. 13, the electronic device N further comprises a lens module 6, a lid 7 and a second glue structure G2. The lens module 6 is disposed on the lens holder 14 of the base structure 1. The lens module 6 comprises a lens 61 and a second signal transmission element 62 connected to the lens 61. For instance, the second signal transmission element 62 comprises a second substrate 620, a second connector 622 disposed on the second substrate 620, and a third transmission line 621 connected between the second connector 622 and the host M. The lens 61 is disposed on the second substrate 620. The lens 61 is electrically connected to the second substrate 620.

The lid 7 is disposed on the base structure 1 and covers the lens module 6. The third transmission line 621 of the second signal transmission element 62 is disposed between the lid 7 and the base structure 1. The base structure 1 further comprises a first fixing portion 17 disposed on the base body 11. The lid 7 comprises a lid body 71 and a second fixing portion 72 disposed on the lid body 71 and corresponding in position to the first fixing portion 17. The lid 7 is positioned on the first fixing portion 17 of the base structure 1 by the second fixing portion 72. The lid 7 and the base structure 1 are coupled together, because of a fastening element S fixed to the first fixing portion 17 and second fixing portion 72. In an embodiment, an adhesive glue (not shown) or a rubber pad (not shown) is disposed between the lid 7 and the base structure 1 to increase the tightness between the lid 7 and the base structure 1.

A second hole H2 is disposed between the lid 7 and the base structure 1, between the lid 7 and the third transmission line 621 of the second signal transmission element 62, or between the base structure 1 and the third transmission line 621 of the second signal transmission element 62. The second glue structure G2 is disposed in the second hole H2. Therefore, a second water blocking region Z2 is formed between the base structure 1, lid 7 and second glue structure G2. The third transmission line 621 is clampedly disposed between the lid 7 and the base structure 1. The third transmission line 621 is connected to the host M by running along the base body 11. The second hole H2 is disposed between the lid 7 and the base structure 1, between the lid 7 and the third transmission line 621 of the second signal transmission element 62, or between the base structure 1 and the third transmission line 621 of the second signal transmission element 62 while the third transmission line 621 is passing between the lid 7 and the base structure 1; thus, the second glue structure G2 is disposed in the second hole H2, such that the second water blocking region Z2 is formed between the base structure 1, lid 7 and second glue structure G2. For instance, the second glue structure G2 is a glue which the second hole H2 is filled with, but the present disclosure is not limited thereto.

The lens module 6 further comprises a lens lid 600 disposed on the lens holder 14 of the base structure 1. The lens lid 600 is disposed on the base structure 1 by a glue structure (such as adhesive tape or glue, not shown in the diagrams). The lens lid 600 is light-penetrable; thus, not only does the lens 61 of the lens module 6 capture images through the lens lid 600, but the lens lid 600 also protects the lens 61. Therefore, a water blocking region (not denoted with any reference numeral) is formed between the base structure 1 and the lens lid 600.

Figure 4:
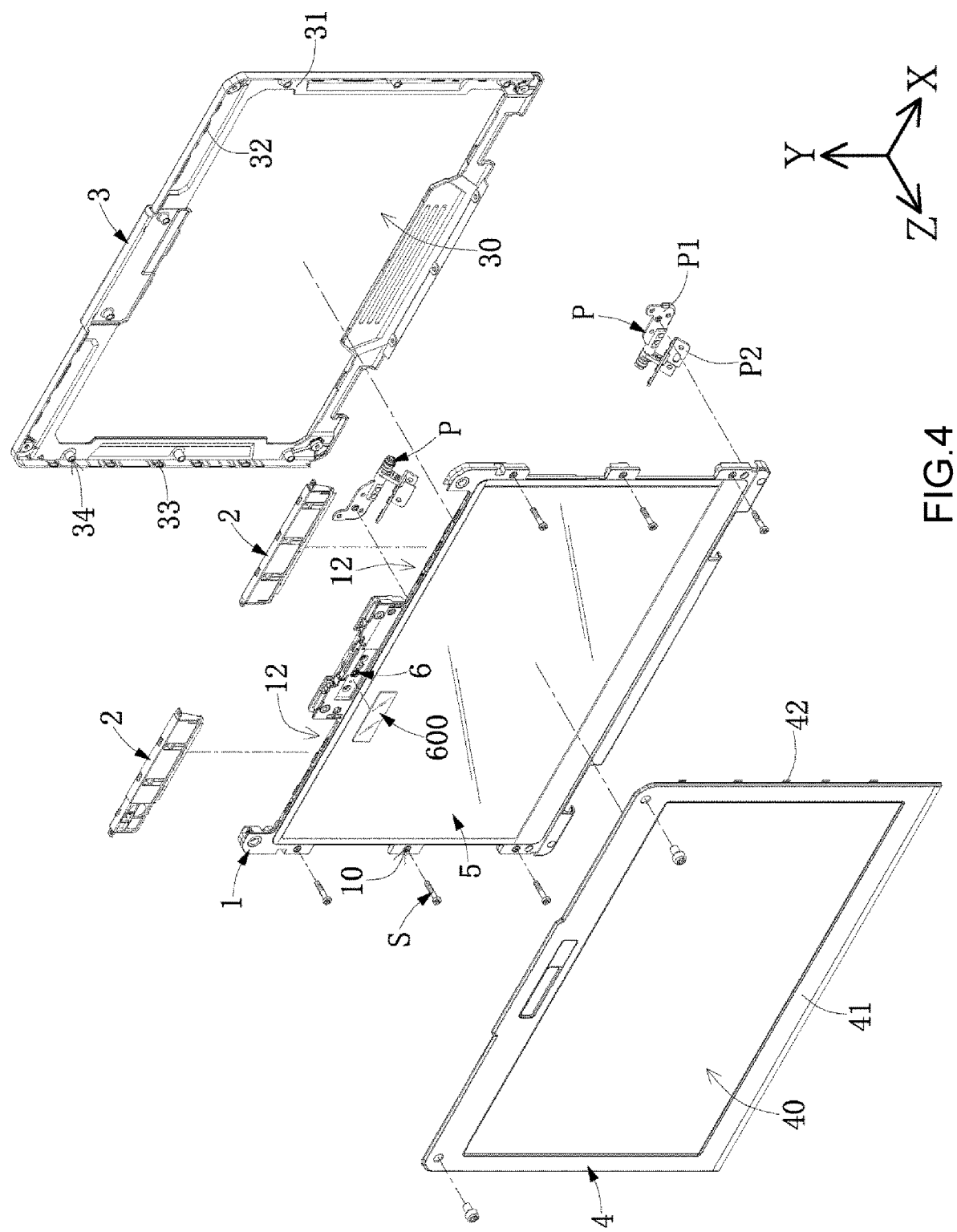
FIG. 4 is an exploded view of the electronic device according to an embodiment of the present disclosure.
Figure 5:
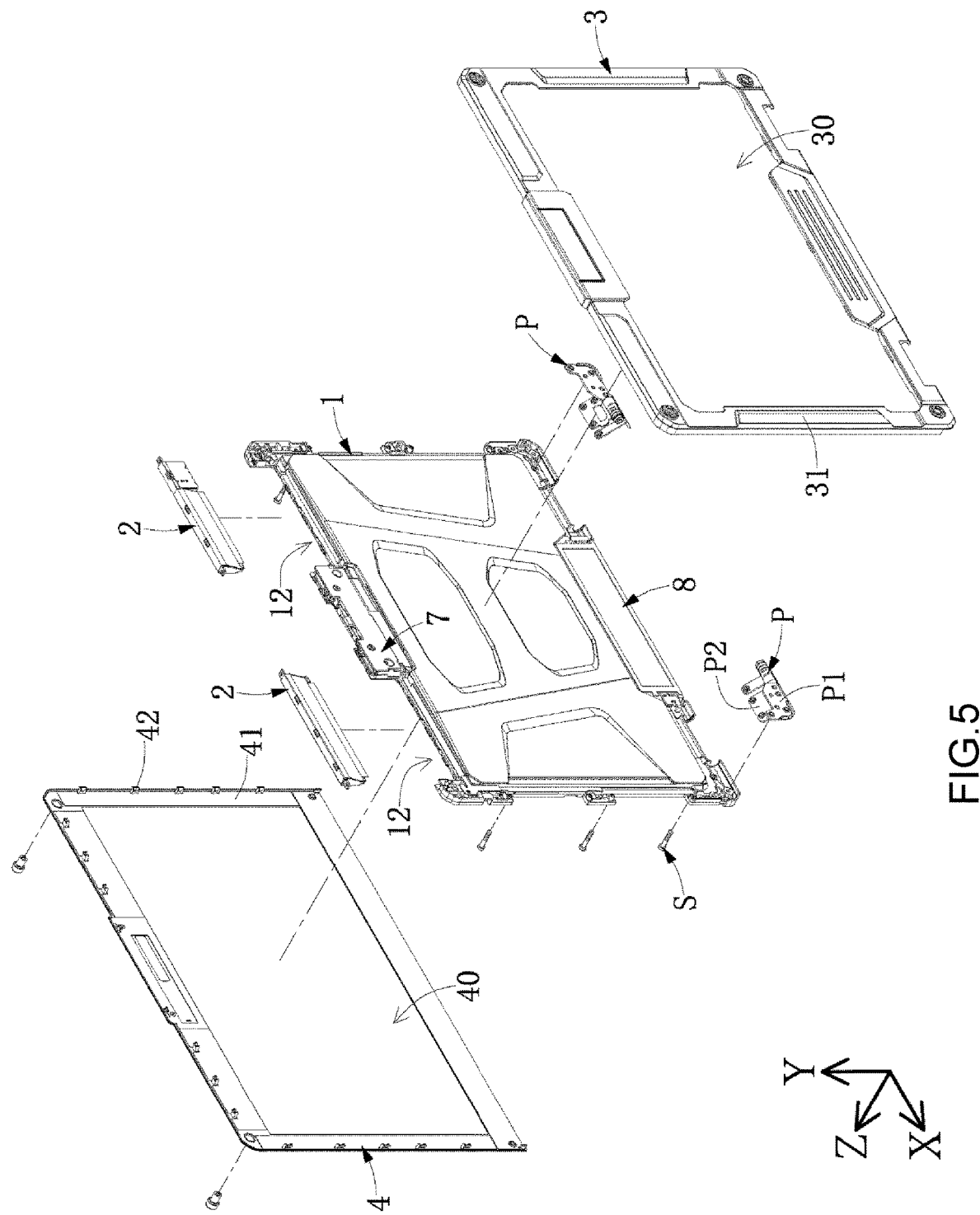
FIG. 5 is another exploded view of the electronic device according to an embodiment of the present disclosure.
Figure 6:
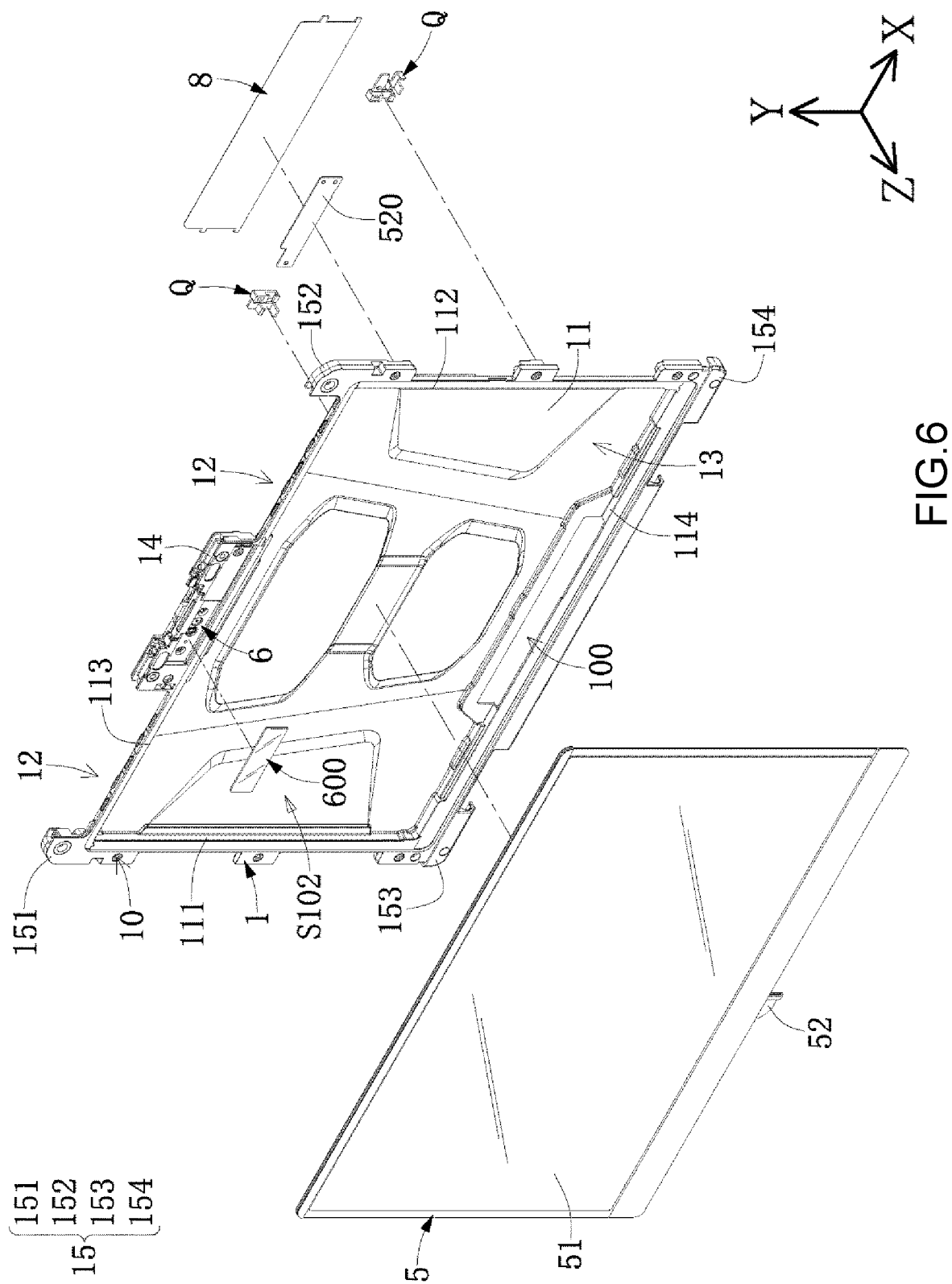
FIG. 6 is yet another exploded view of the electronic device according to an embodiment of the present disclosure.
Figure 7:
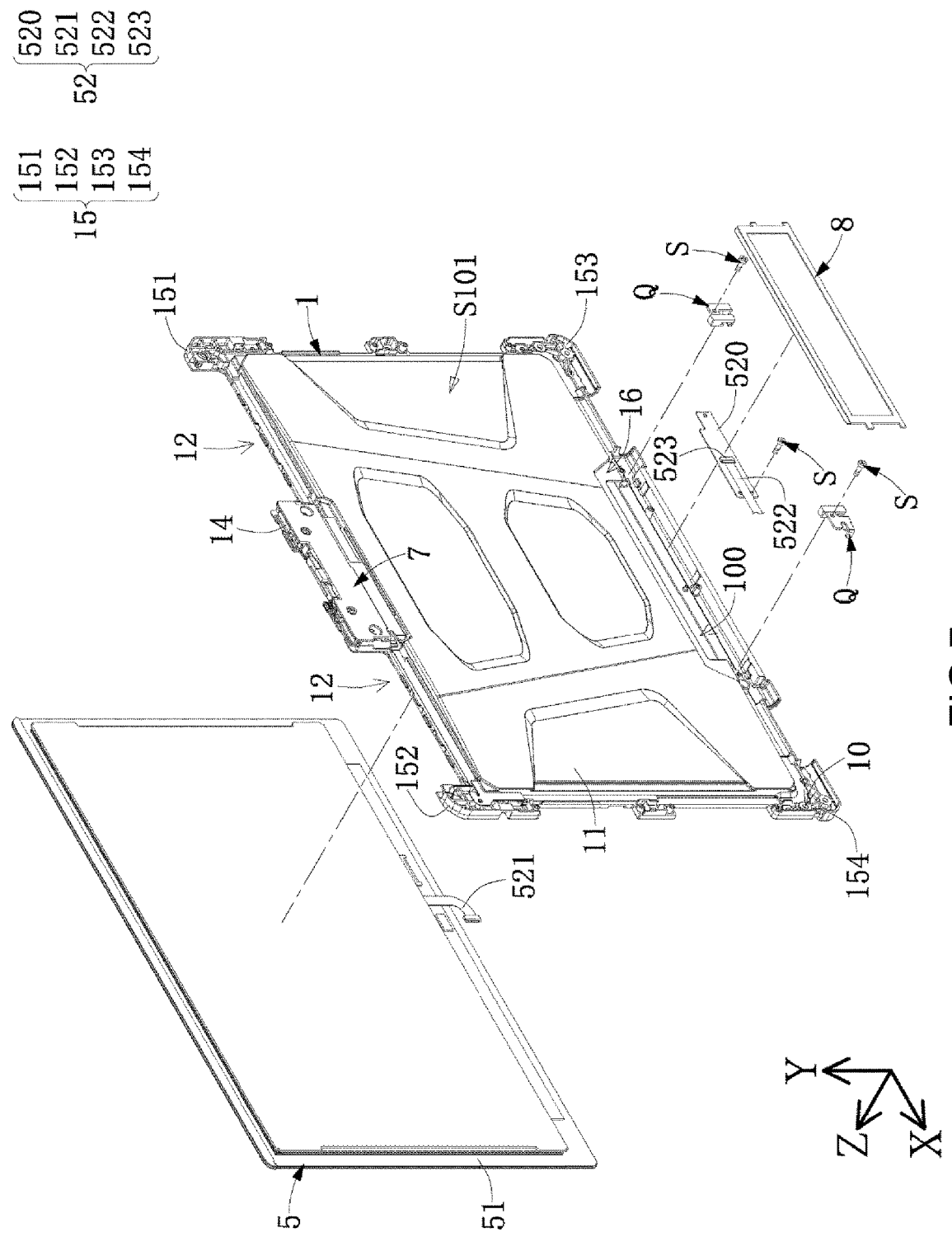
FIG. 7 is still yet another exploded view of the electronic device according to an embodiment of the present disclosure.
Figure 8:
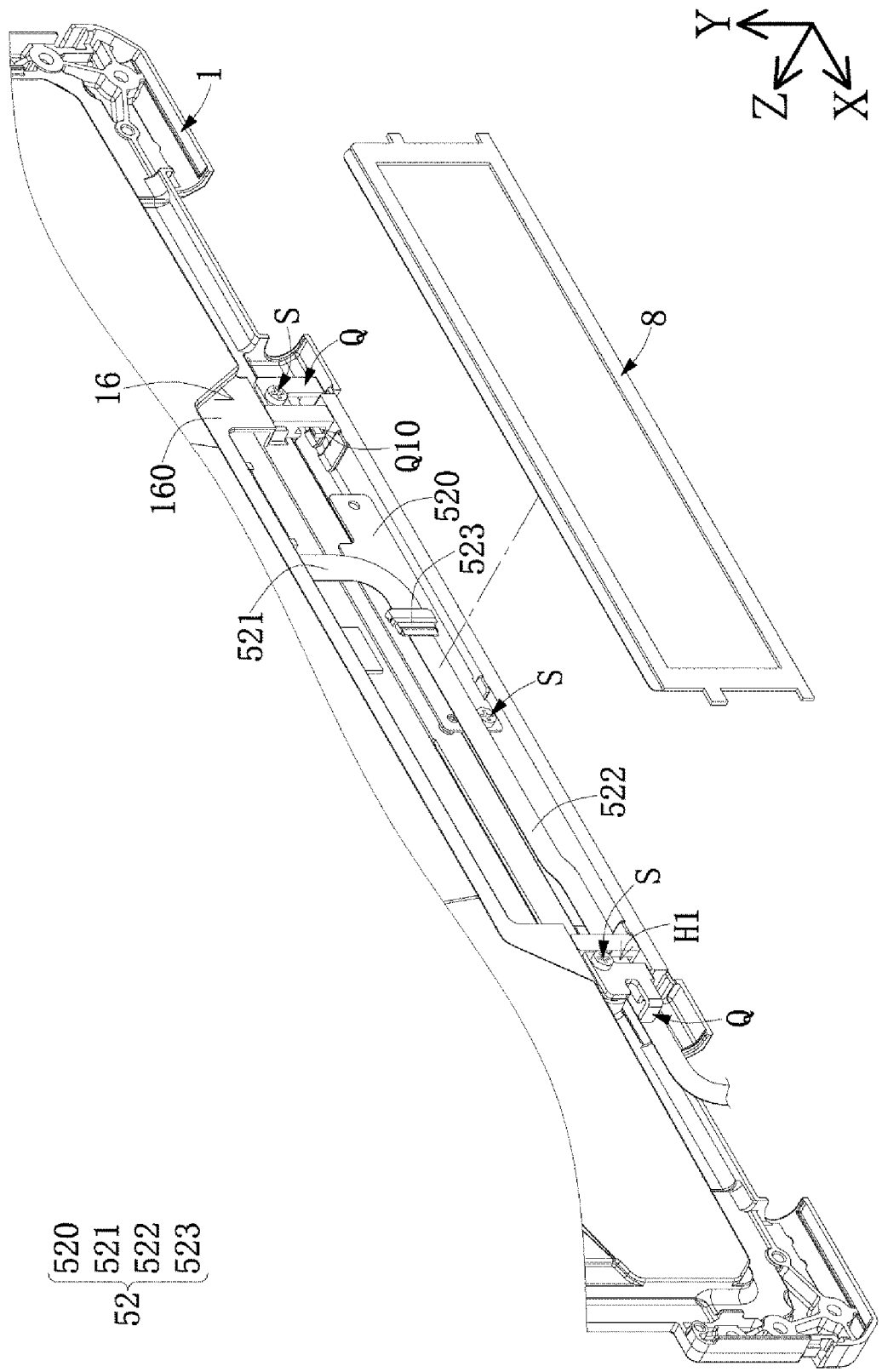
FIG. 8 is an exploded view of a first water blocking region of the electronic device according to an embodiment of the present disclosure.
Figure 9:
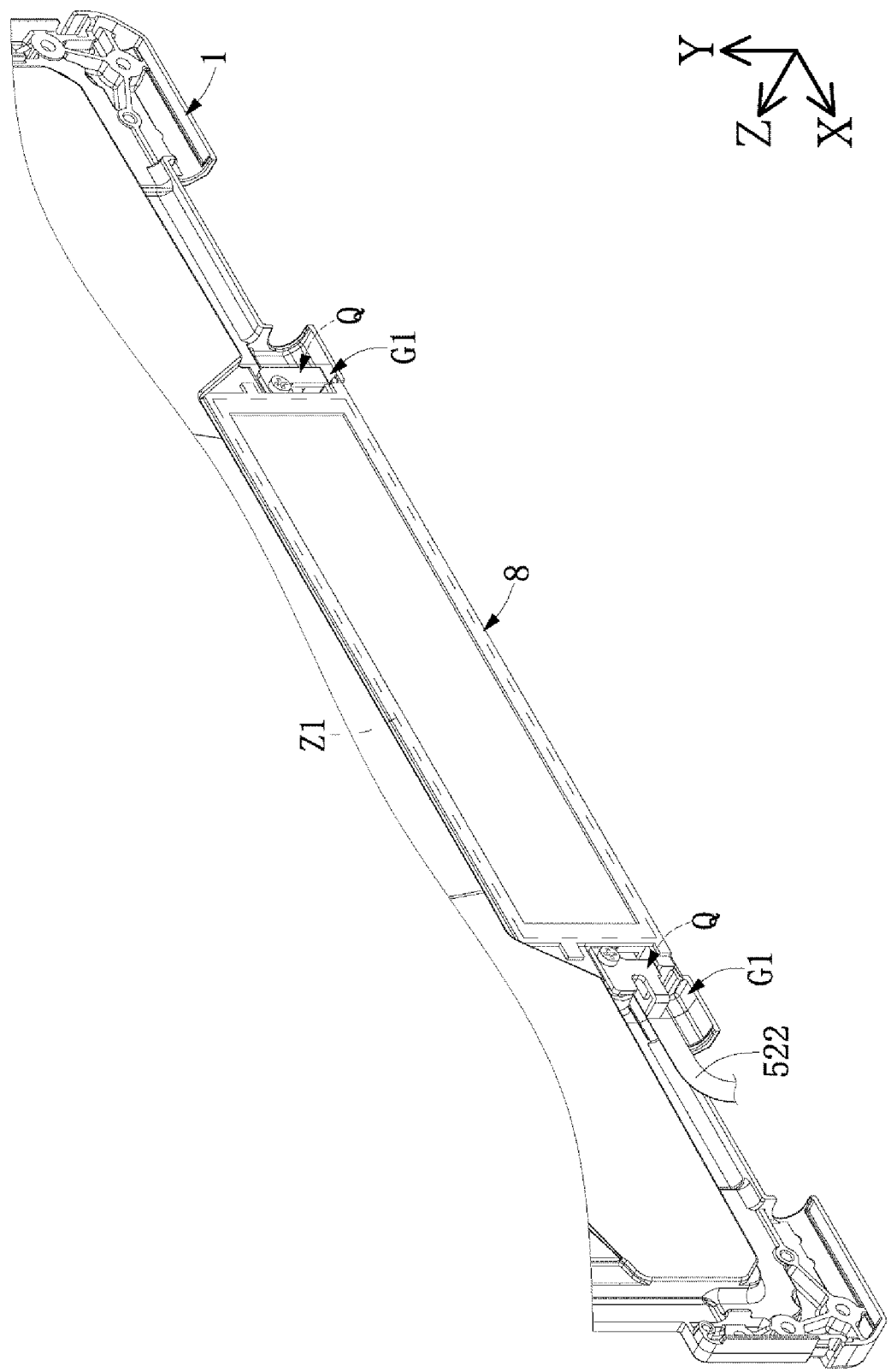
FIG. 9 is an assembled schematic view of the first water blocking region of the electronic device according to an embodiment of the present disclosure.
Figure 10:
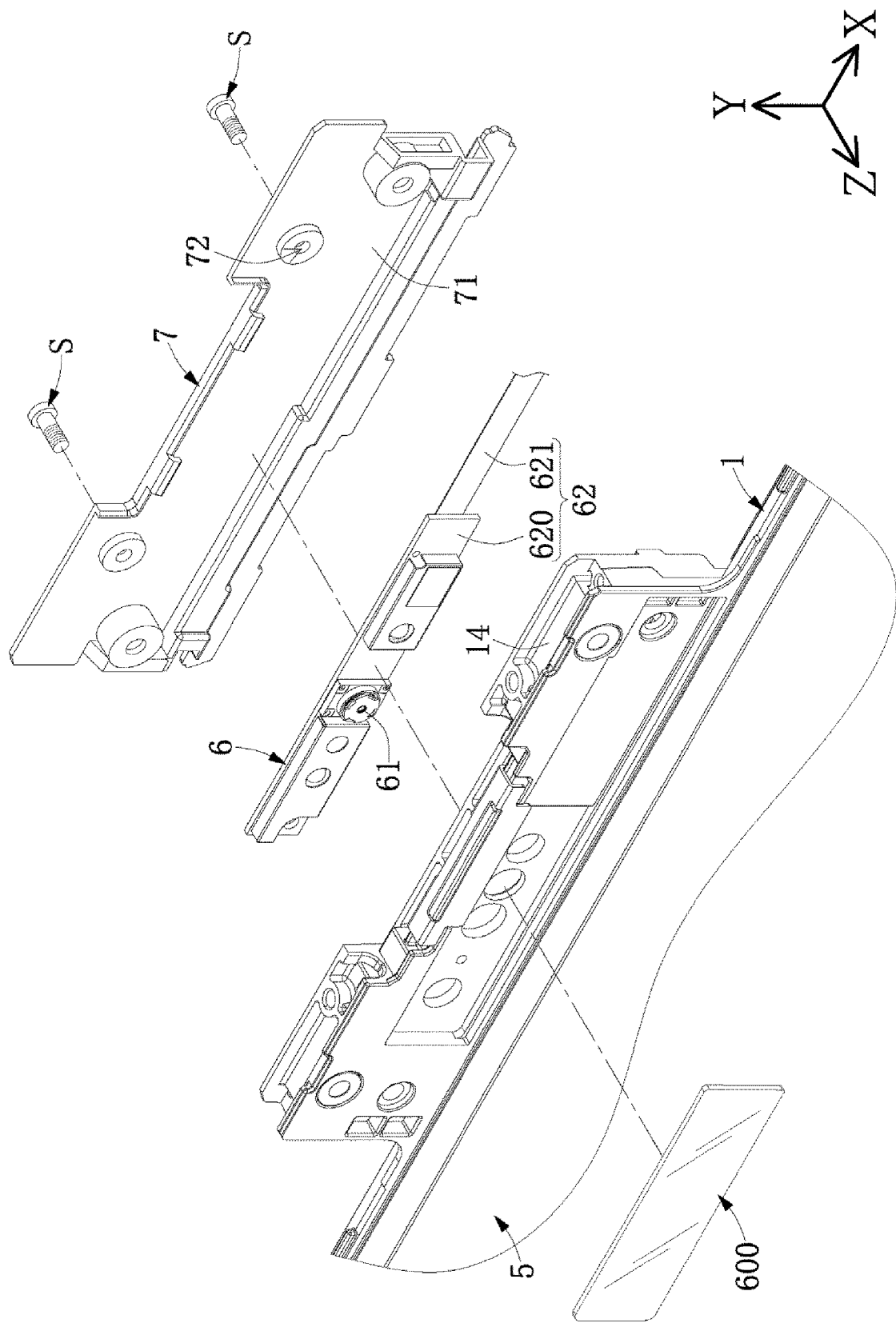
FIG. 10 is an exploded view of a second water blocking region of the electronic device according to an embodiment of the present disclosure.
Figure 11:
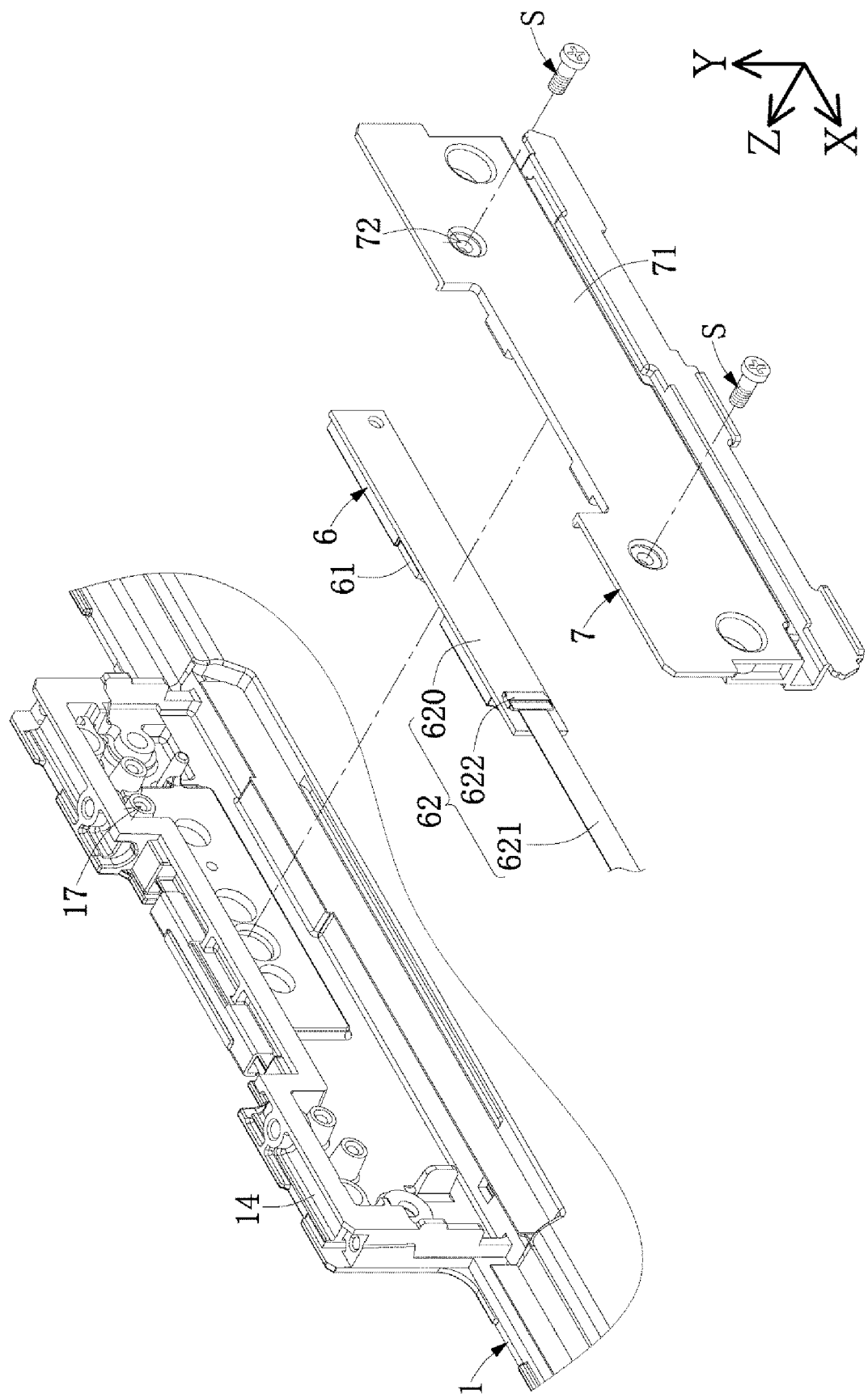
FIG. 11 is another exploded view of the second water blocking region of the electronic device according to an embodiment of the present disclosure.
Figure 12:
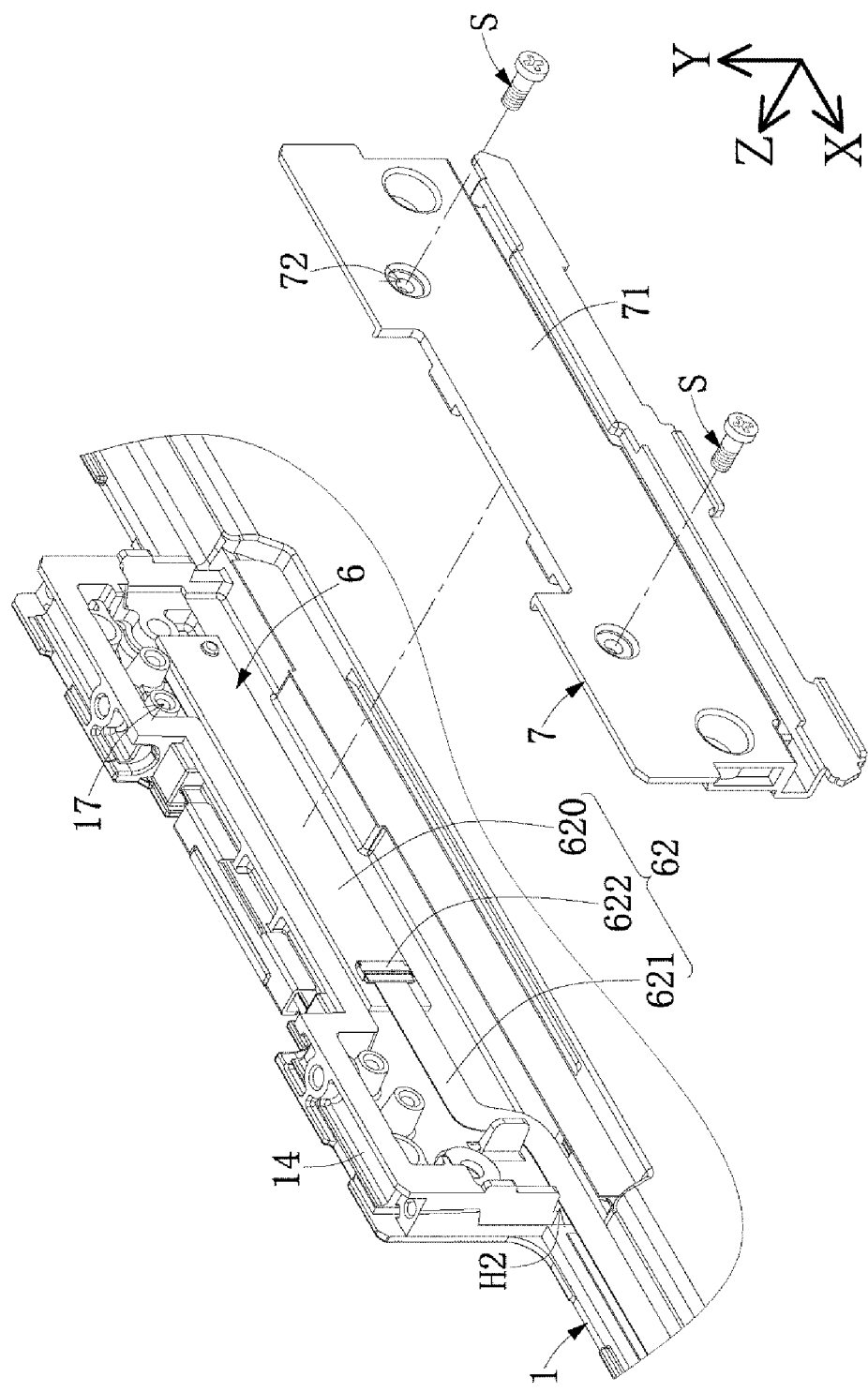
FIG. 12 is yet another exploded view of the second water blocking region of the electronic device according to an embodiment of the present disclosure.
Figure 13:
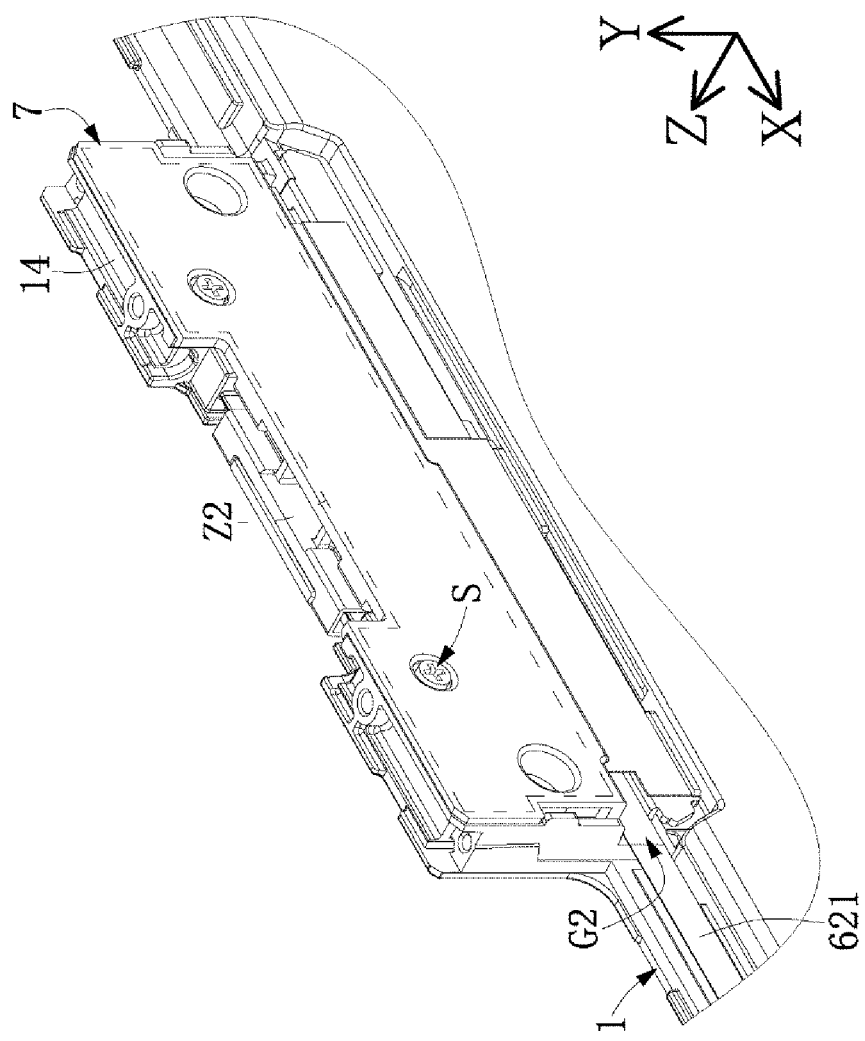
FIG. 13 is an assembled schematic view of the second water blocking region of the electronic device according to an embodiment of the present disclosure.
Figure 14:
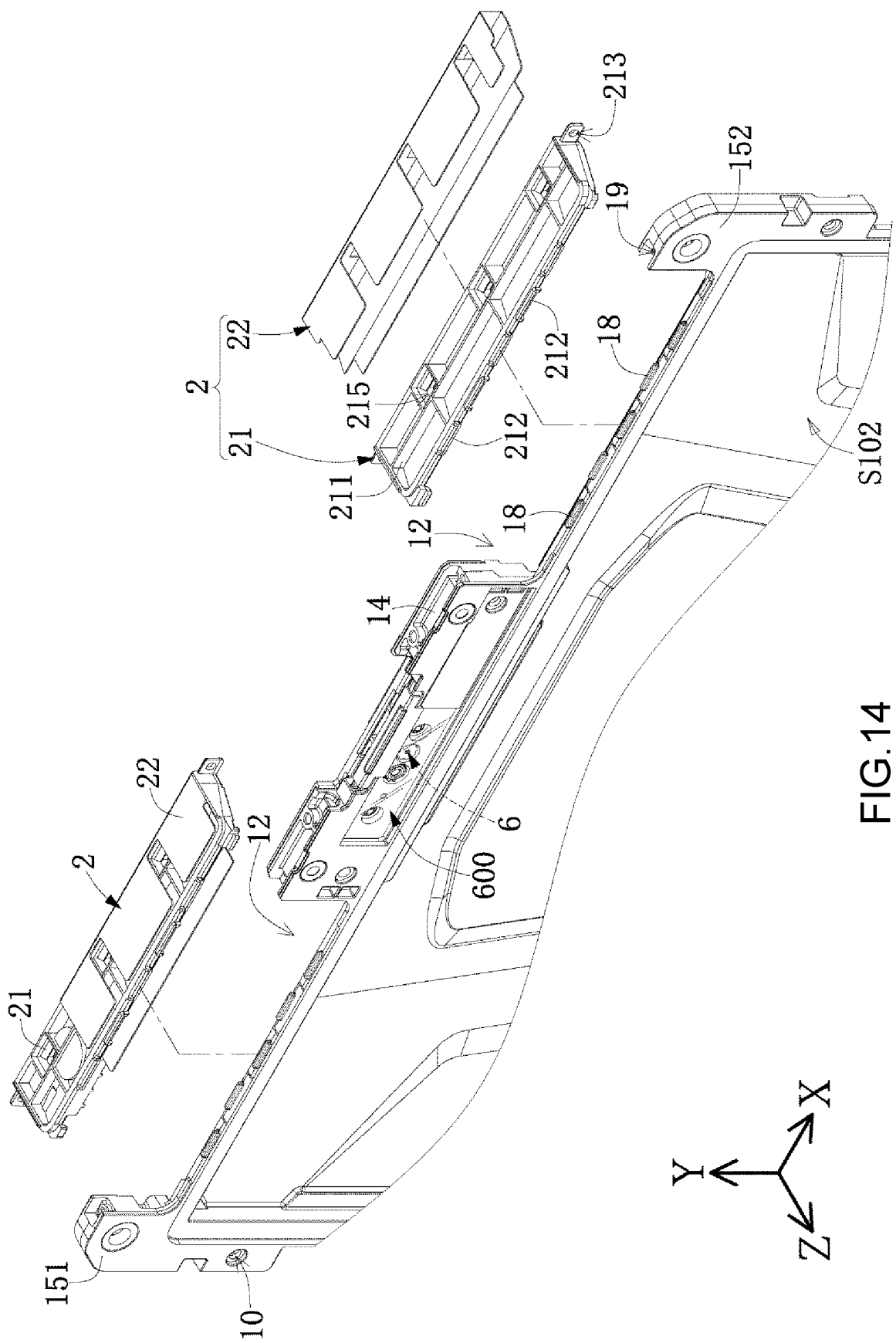
FIG. 14 is an exploded view of a base structure and an antenna module of the electronic device according to an embodiment of the present disclosure.

Refer to FIG. 4, FIG. 5, and FIG. 14. The base structure 1 further comprises a first positioning portion 18 disposed on the receiving slot 12, whereas the antenna module 2 further comprises a mount element 21 and an antenna 22 disposed on the mount element 21. The mount element 21 comprises a second positioning portion 212 corresponding in position to the first positioning portion 18. The first positioning portion 18 and second positioning portion 212 abut against each other and thus are coupled together, such that the antenna module 2 is fixed to the base structure 1 because of the mount element 21. The base structure 1 further comprises a first engaging portion 19 disposed on the base body 11 and positioned proximate to the receiving slot 12. The mount element 21 further comprises a second engaging portion 213 corresponding in position to the first engaging portion 19. The mount element 21 further comprises a mount body 211. Both the second positioning portion 212 and second engaging portion 213 are disposed on the mount body 211. The antenna 22 shown in the accompanying drawings merely serves an illustrative purpose.

For instance, the base structure 1 comprises a plurality of first positioning portions 18, and the mount element 21 comprises a plurality of second positioning portions 212. The plurality of first positioning portions 18 protrudes and extends in a first direction (positive direction Y) relative to the base body 11. The plurality of second positioning portions 212 protrudes and extends in a second direction (negative direction Y) relative to the mount body 211. The first direction (positive direction Y) and the second direction (negative direction Y) are opposite. The plurality of first positioning portions 18 are arranged in an array and sequentially arranged in a predetermined arrangement direction (direction X) relative to the base body 11. One of the two adjacent first positioning portions 18 is closer to the first surface S101 than the other first positioning portion 18. The other one of the two adjacent first positioning portions 18 is closer to the second surface S102 than the other first positioning portion 18. The plurality of first positioning portions 18 are each I-shaped. Therefore, every two adjacent ones of the I-shaped first positioning portions 18 alternate.

The plurality of second positioning portions 212 are arranged in an array and sequentially arranged in a predetermined arrangement direction (direction X) relative to the mount body 211. The plurality of second positioning portions 212 are each U-shaped. The U-shaped second positioning portions 212 open toward the first surface S101 or second surface S102. In a variant embodiment, every two adjacent ones of the second positioning portions 212 open in opposite directions. In a variant embodiment, one of every two adjacent second positioning portions 212 opens toward the first surface S101, but the other one opens toward the second surface S102. Therefore, every two adjacent ones of the U-shaped second positioning portions 212 alternate.

For instance, the base structure 1 comprises two first engaging portions 19. The two first engaging portions 19 are disposed at two ends of the receiving slot 12, respectively. One of the first engaging portions 19 is disposed at the first extension angle 151. The other first engaging portion 19 is disposed on the lens holder 14. The mount element 21 comprises two second engaging portions 213. The two second engaging portions 213 are disposed at two ends of the mount element 21, respectively. The first engaging portions 19 are each recess-shaped. The second engaging portions 213 are each protrusion-shaped. The second engaging portions 213 are received in the first engaging portions 19. In an embodiment, the first engaging portions 19 and second engaging portions 213 have corresponding screw holes (not denoted with any reference numerals) which mesh with screws (not shown) for fixing the second engaging portions 213 to the first engaging portions 19.

Therefore, the antenna module 2 is disposed on the base structure 1 in such a manner to allow the first positioning portion 18 to abut against the second positioning portion 212, allow the I-shaped first positioning portion 18 to be received in the U-shaped second positioning portion 212, and allow the second engaging portion 213 to be received in the first engaging portion 19, such that the antenna module 2 can only be removed in the first direction (positive direction Y) relative to the base structure 1. The present disclosure is not limited to whether the first engaging portion 19 and second engaging portion 213 have screw holes or not. Therefore, in a variant embodiment of the present disclosure, the antenna module 2 is disposed on the base structure 1 just because of the first positioning portion 18, second positioning portion 212, first engaging portion 19 and second engaging portion 213.

Figure 15:
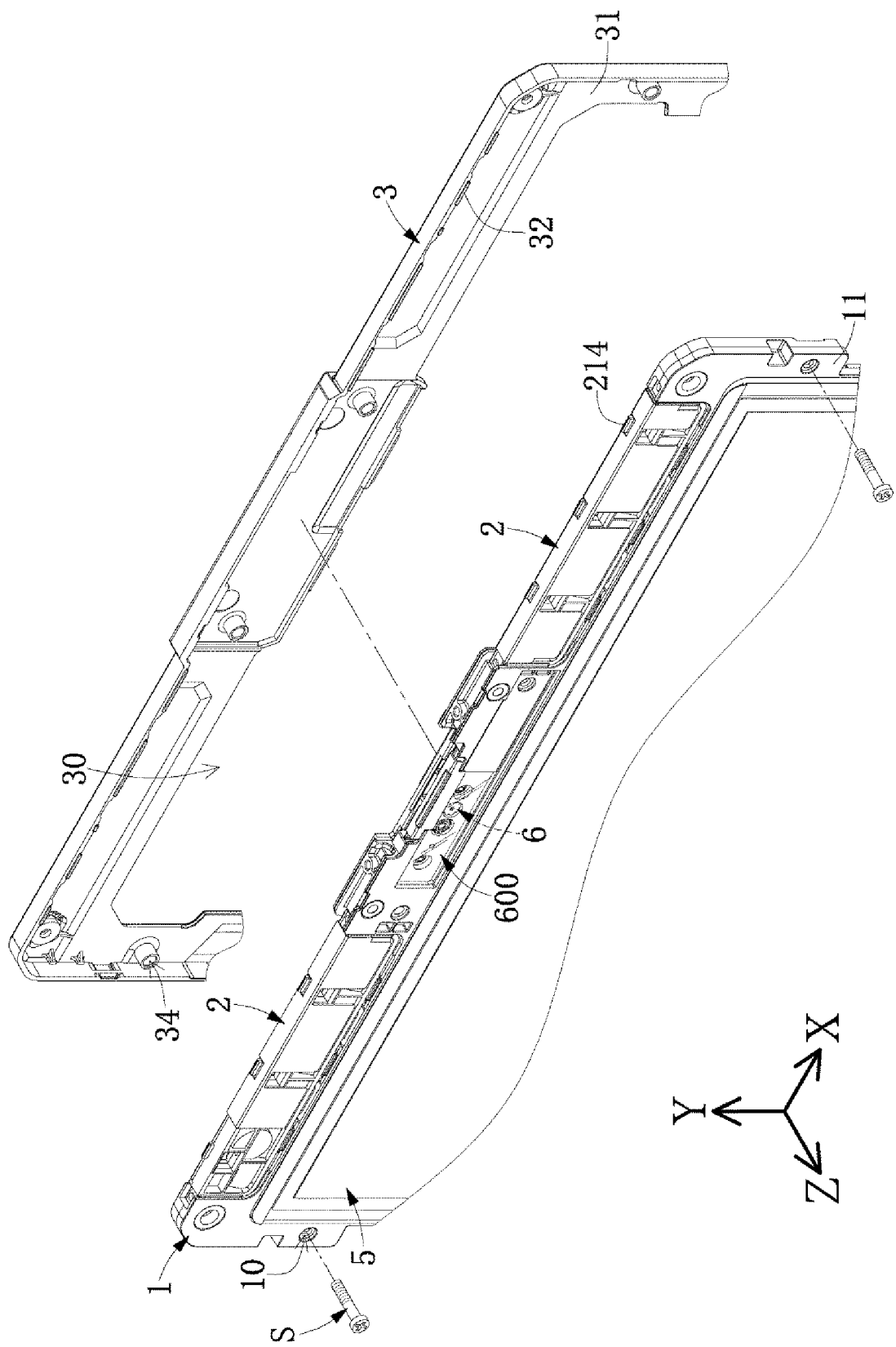
FIG. 15 is an exploded view of the base structure, antenna module and first decorative board of the electronic device according to an embodiment of the present disclosure.
Figure 16:
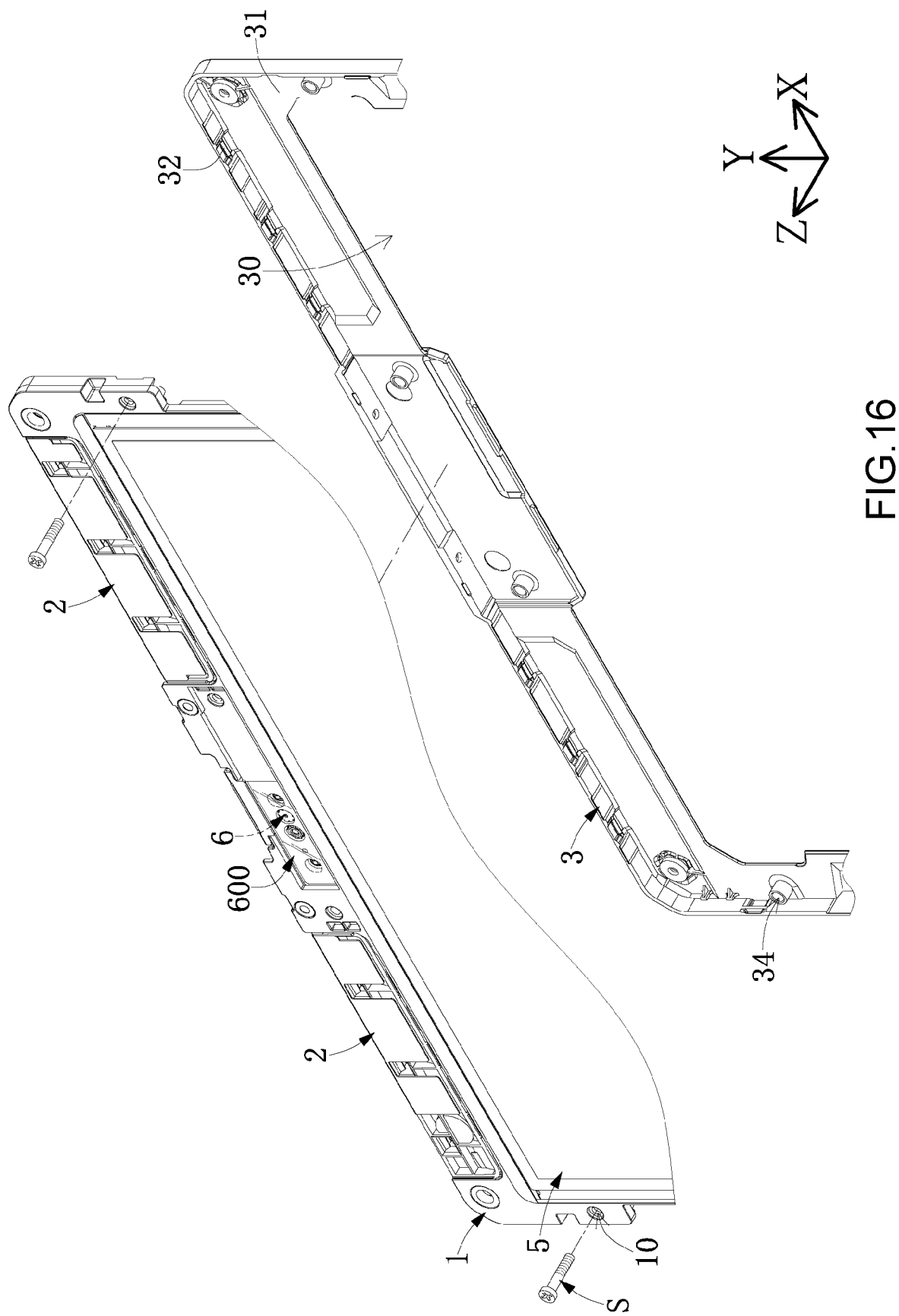
FIG. 16 is another exploded view of the base structure, antenna module and first decorative board of the electronic device according to an embodiment of the present disclosure.

Referring to FIG. 15 and FIG. 16, the mount element 21 further comprises a third positioning portion 214. The third positioning portion 214 is disposed on the mount body 211. The third positioning portion 214 extends in the first direction (positive direction Y) relative to the mount body 211. The second positioning portion 212 and the third positioning portion 214 are disposed at two opposing edges of the mount element 21, respectively. The first decorative board 3 further comprises a first frame body 31 and a fourth positioning portion 32 disposed on the first frame body 31 and corresponding in position to the third positioning portion 214. The fourth positioning portion 32 protrudes and extends in a second direction (negative direction Y) relative to the first decorative board 3.

For instance, the mount element 21 comprises a plurality of third positioning portions 214, and the first decorative board 3 comprises a plurality of fourth positioning portions 32. The plurality of third positioning portions 214 are arranged in an array and sequentially arranged in a predetermined arrangement direction (direction X) relative to the mount body 211. The plurality of fourth positioning portions 32 are arranged in an array and sequentially arranged in a predetermined arrangement direction (direction X) relative to the first frame body 31. Therefore, when the first decorative board 3 is mounted in the direction of the base structure 1 and the antenna module 2, the third positioning portion 214 can abut against the fourth positioning portion 32, whereas the third positioning portion 214 and fourth positioning portion 32 can be coupled together, thereby allowing the first decorative board 3 to be fixed to the base structure 1 and the antenna module 2.

The electronic device N further comprises a plurality of fastening elements S. The base body 11 of the base structure 1 further comprises a plurality of fastening holes 10. The first decorative board 3 further comprises a plurality of fastening apertures 34. The plurality of fastening apertures 34 of the first decorative board 3 correspond in position to the plurality of fastening holes 10 of the base body 11, respectively. The first decorative board 3 is further fixed to the base structure 1 by the plurality of fastening elements S.

The first opening 30 is surrounded by the first frame body 31. The first frame body 31 covers the periphery of the base structure 1 and the water blocking film 8.

Figure 17:
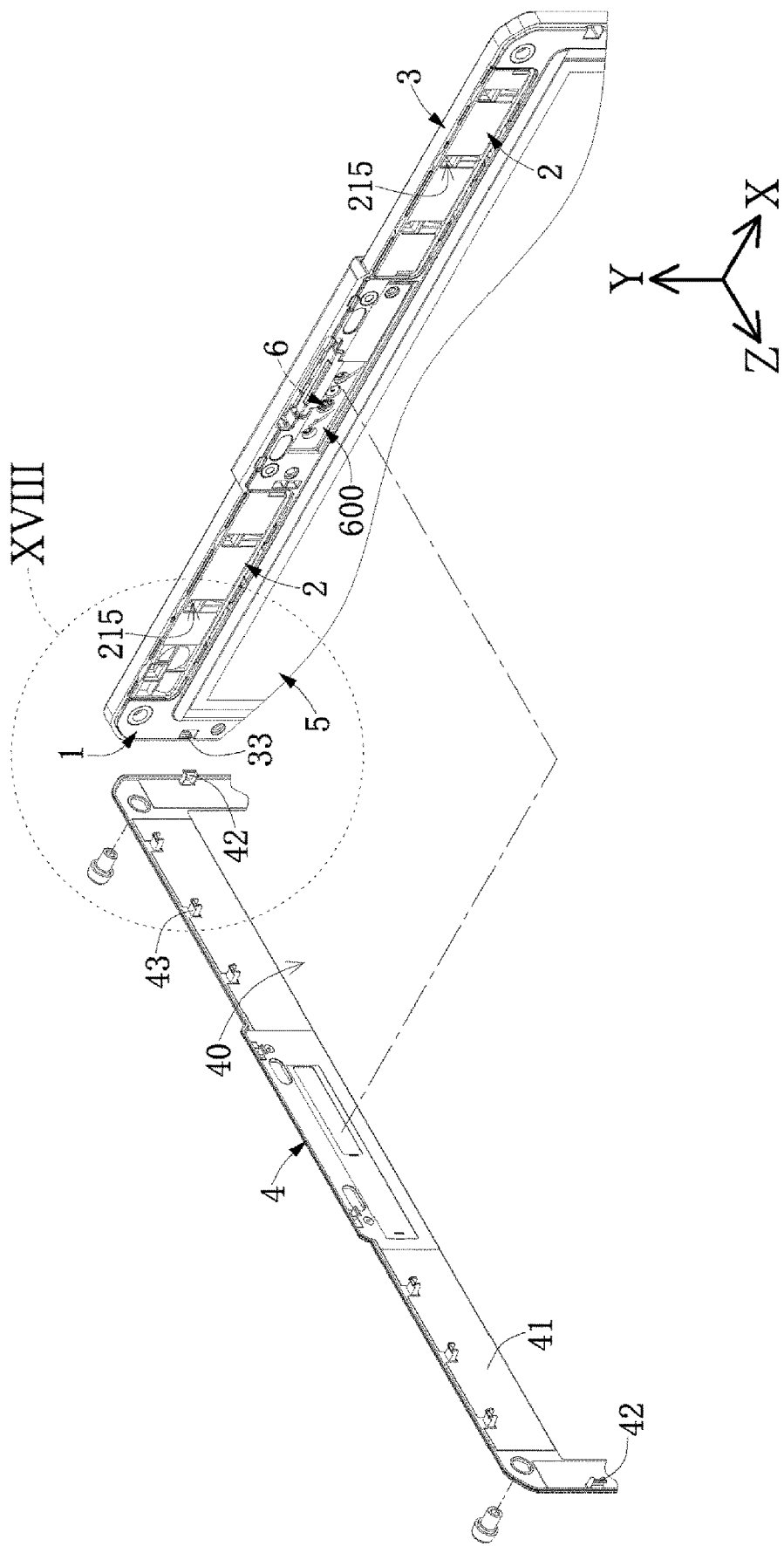
FIG. 17 is an exploded view of the base structure, antenna module, first decorative board and second decorative board of the electronic device according to an embodiment of the present disclosure.
Figure 18:
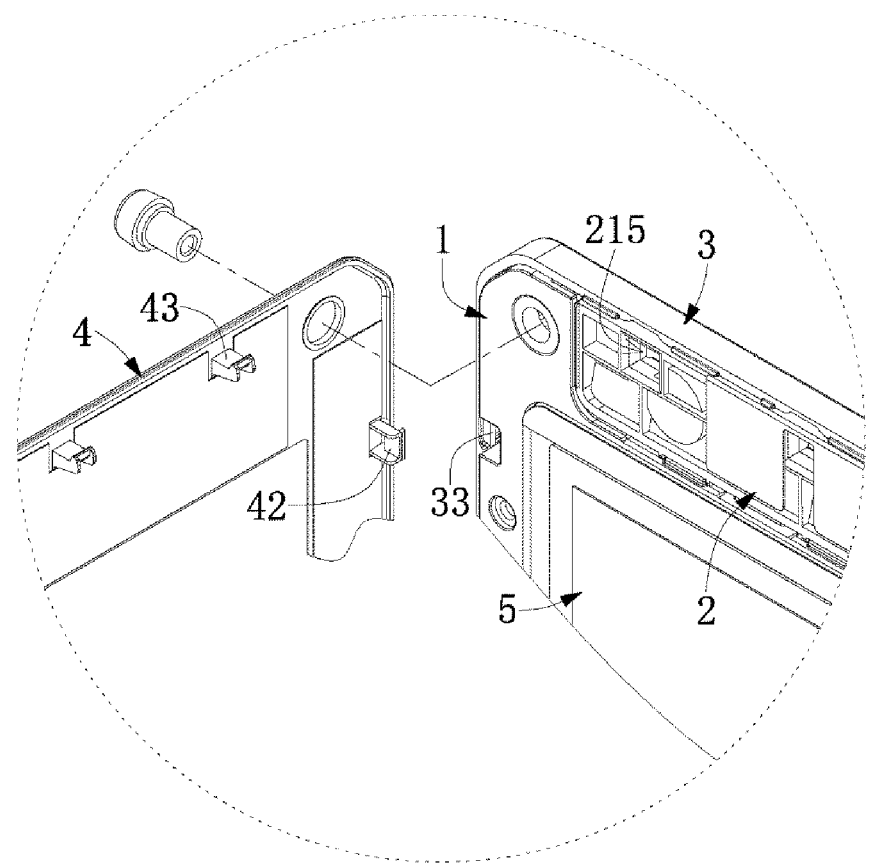
FIG. 18 is an enlarged view of part XVIII of FIG. 17.

Referring to FIG. 17 and FIG. 18, the first decorative board 3 further comprises a first coupling portion 33 disposed on the first frame body 31, and the second decorative board 4 further comprises a second coupling portion 42 disposed on the second frame body 41 and corresponding in position to the first coupling portion 33. The second coupling portion 42 of the second decorative board 4 is fixed to the first coupling portion 33 of the first decorative board 3. Therefore, the second coupling portion 42 of the second decorative board 4 is coupled to the first coupling portion 33 of the first decorative board 3, so as to fix the second decorative board 4 to the first decorative board 3 and the base structure 1. For instance, in the embodiments illustrated by the diagrams, the second coupling portion 42 is a hook, and the first coupling portion 33 is a loop-shaped recess, thereby allowing the second coupling portion 42 and the first coupling portion 33 to be engaged with each other. However, the present disclosure is not limited to the aforesaid embodiment of the first coupling portion 33 and second coupling portion 42.

The mount element 21 further comprises a first limiting portion 215 disposed on the mount body 211. The second decorative board 4 further comprises a second limiting portion 43 disposed on the second frame body 41 and corresponding in position to the first limiting portion 215. The second decorative board 4 is fixed to the first limiting portion 215 of the mount element 21 by the second limiting portion 43. Therefore, the antenna module 2 is fixed in place even in the absence of any screws, because of limitations placed on the displacement of the antenna module 2 relative to the base structure 1 by the first positioning portion 18, second positioning portion 212, first engaging portion 19 and second engaging portion 213, relative to the first decorative board 3 by the third positioning portion 214 and fourth positioning portion 32, and relative to the second decorative board 4 by the first limiting portion 215 and second limiting portion 43.

Beneficial Effects of Embodiment

One of the beneficial effects of the present disclosure is as follows: the electronic device N of the present disclosure is advantageously characterized by a first water blocking region Z1 formed between the base structure 1, water blocking film 8 and first glue structure G1 to augment the water-blocking capability of the electronic device N and thereby preclude the effect of ambient moisture or liquid on the panel 5. Furthermore, the electronic device N of the present disclosure is advantageously characterized by a second water blocking region Z2 formed between the base structure 1, lid 7 and second glue structure G2 to augment the water-blocking capability of the electronic device N and thereby preclude the effect of ambient moisture or liquid on the lens module 6. Compared with the prior art, the present disclosure is effective in reducing the area of the water blocking regions greatly by forming two water blocking regions (the first water blocking region Z1 and second water blocking region Z2).

The present disclosure is disclosed above by preferred embodiments. However, the preferred embodiments are not restrictive of the claims of the present disclosure. Hence, all equivalent technical changes made to the aforesaid embodiments and based on the contents of the specification and drawings of the present disclosure shall fall within the scope of the claims of the present disclosure.

What is claimed is:

1. An electronic device, comprising:
a base structure having a first surface and a second surface corresponding in position to the first surface and comprising a base body, a receiving recess disposed on the base body, and a slit penetrating the base body;
a panel disposed in the receiving recess and on the second surface, wherein the panel comprises a panel body and a first signal transmission element, the first signal transmission element being connected to the panel body and passing through the slit;
a water blocking film disposed on the first surface of the base structure to cover the slit, wherein a first hole is disposed between the base structure and the first signal transmission element or disposed between the water blocking film and the first signal transmission element; and
a first glue structure disposed in the first hole,
wherein a first water blocking region is formed between the base structure, the water blocking film and the first glue structure.

2. The electronic device of claim 1, wherein the base structure further comprises a recess disposed around the slit and dented relative to the base body, and the recess has an attachment surface which the water blocking film is disposed on.

3. The electronic device of claim 1, wherein the water blocking film is light-penetrable.

4. The electronic device of claim 1, further comprising a connection structure disposed on the first surface of the base structure, wherein a pore is disposed between the connection structure and the base structure or disposed on the connection structure, allowing the first signal transmission element to pass through the pore.

5. The electronic device of claim 1, further comprising a lens module, a lid and a second glue structure, the lens module being disposed on the base structure and comprising a lens and a second signal transmission element connected to the lens, the lid being disposed on the base structure to cover the lens module, wherein a second hole is disposed between the lid and the base structure, between the lid and the second signal transmission element, or between the base structure and the second signal transmission element, allowing the second glue structure to be disposed in the second hole, wherein a second water blocking region is formed between the base structure, the lid and the second glue structure.

6. The electronic device of claim 5, wherein the base structure further comprises a first fixing portion disposed on the base body, and the lid comprises a lid body and a second fixing portion disposed on the lid body and corresponding in position to the first fixing portion, wherein the lid is positioned on the first fixing portion of the base structure by the second fixing portion.

7. The electronic device of claim 5, further comprising a first decorative board disposed on the first surface of the base structure, wherein the first decorative board has a first opening for exposing the first surface of the base structure.

8. The electronic device of 7, further comprising a second decorative board disposed on the second surface of the base structure, wherein the second decorative board has a second opening for exposing the panel body disposed on the first surface of the base structure.

9. The electronic device of claim 8, wherein the first decorative board comprises a first frame body and a first coupling portion disposed on the first frame body, wherein the second decorative board comprises a second frame body and a second coupling portion disposed on the second frame body and corresponding in position to the first coupling portion, such that the second coupling portion of the second decorative board is fixed to the first coupling portion of the first decorative board.

* * * * *